(12) United States Patent
Tanaka et al.

(10) Patent No.: US 7,194,242 B2
(45) Date of Patent: Mar. 20, 2007

(54) DIRECT-CONVERSION TRANSMITTER CIRCUIT AND TRANSCEIVER SYSTEM

(75) Inventors: Satoshi Tanaka, Kokubunji (JP); Taizo Yamawaki, Tokyo (JP); Kazuaki Hori, Yokohama (JP); Kazuo Watanabe, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 482 days.

(21) Appl. No.: 10/739,282
(22) Filed: Dec. 19, 2003

(65) Prior Publication Data

US 2004/0137862 A1   Jul. 15, 2004

(30) Foreign Application Priority Data

Dec. 20, 2002   (JP) .............................. 2002-369761

(51) Int. Cl.
  *H04B 1/04*   (2006.01)
  *H03G 3/20*   (2006.01)
(52) U.S. Cl. ...................... 455/127.3; 455/73; 330/133
(58) Field of Classification Search .. 455/127.1–127.3, 455/73, 91, 102, 103, 88, 553.1, 552.1, 113, 455/114.2, 232.1, 141, 403, 118, 125, 124, 455/123; 327/359; 375/345, 295; 330/10, 330/133
See application file for complete search history.

(56) References Cited

U.S. PATENT DOCUMENTS 5,926,749 A * 7/1999 Igarashi et al. .......... 455/127.2

(Continued)

FOREIGN PATENT DOCUMENTS

JP   55-011687   12/1978

(Continued)

OTHER PUBLICATIONS

Takikawa, K., et al., "RF Circuits Technique of Dual-band Transceiver IC for GSM and DCS1800 applications", IEEE 25th European Solid-State Circuits Conference, 1999 pp. 278-281.

(Continued)

*Primary Examiner*—Aung Moe
(74) *Attorney, Agent, or Firm*—Reed Smith LLP; Stanley P. Fisher, Esq.; Juan Carlos A. Marquez, Esq.

(57) ABSTRACT

Disclosed is a direct conversion type transmitter or transceiver circuit suitable for a mobile communication device which corresponds to broad signal output level variable width to be required by W-CDMA, which does not necessitate any high-performance low noise VCO and RF filter, capable of reducing a number of components and the cost. In the input portion of an orthogonal modulator composed of a divider, mixers, and a common load, there are provided variable attenuators. If an input signal level of the orthogonal modulator within the transmitter circuit lowers, this variable attenuator circuit is operated so as to lower the bias of the orthogonal modulator to reduce the amount of occurrence of carrier leak, and to prevent the signal during low output level and carrier leak ratio from being deteriorated. The direct conversion transmitter circuit is capable of easily realizing output level variable width of 70 dB or higher and reducing a variable amount in the high frequency circuit in which it is difficult to secure the variable gain width.

8 Claims, 17 Drawing Sheets

U.S. PATENT DOCUMENTS

| | | | |
|---|---|---|---|
| 6,073,000 A | 6/2000 | Shinohara | |
| 6,212,369 B1* | 4/2001 | Avasarala | 455/333 |
| 6,480,700 B1* | 11/2002 | Groe et al. | 455/73 |
| 6,711,391 B1* | 3/2004 | Walker et al. | 455/127.3 |
| 2001/0026600 A1* | 10/2001 | Mochizuki et al. | 375/345 |
| 2002/0039894 A1 | 4/2002 | Yoshida et al. | |
| 2002/0140520 A1 | 10/2002 | Hikita et al. | |
| 2003/0092416 A1 | 5/2003 | Tanaka et al. | |
| 2003/0138034 A1* | 7/2003 | Shi et al. | 375/344 |
| 2004/0023620 A1* | 2/2004 | Sahota et al. | 455/91 |
| 2005/0159180 A1* | 7/2005 | Cheng et al. | 455/552.1 |

FOREIGN PATENT DOCUMENTS

| | | |
|---|---|---|
| JP | 9-36768 | 7/1995 |
| JP | 09-064647 | 8/1995 |
| JP | 2001-284998 | 3/2000 |
| JP | 2002-64397 | 8/2000 |
| JP | 2002-359542 | 2/2002 |
| JP | 2003-152563 | 3/2002 |
| WO | WO 01/03395 A1 | 6/2000 |

OTHER PUBLICATIONS

Yamawaki, T., et al., "A 2.7-V GSM RF Transceiver IC", IEEE Journal of Solid-State Circuits, vol. 32, No. 12, 1997, pp. 2089-2096.

* cited by examiner

US 7,194,242 B2

DIRECT-CONVERSION TRANSMITTER CIRCUIT AND TRANSCEIVER SYSTEM

PRIORITY CLAIM

The present invention claims priority under 35 USC §119 to Japanese patent application 2002-369761 filed Dec. 20, 2002, the entire disclosure of which is hereby incorporated by reference herein.

FIELD OF THE INVENTION

The present invention relates to a transmitter circuit and a transceiver system, and more particularly to a transmitter circuit suitable for a mobile communication device to which a direct conversion system suitable for large scale integration has been applied, and a transceiver system using the same.

BACKGROUND OF THE INVENTION

Along with the burst of penetration of the mobile communication devices, the request for miniaturization at lower cost has been increasing. For this reason, it is desired to apply an integrated circuit the integration density of which has been improved by decreasing voltage control type oscillators (VCO) and a number of filters. As one of conventional examples of transmitters, there has been dual band transceiver IC high-frequency technique (See non-patent literature 1, K. Takikawa et. al. "RF Circuits Technique of Dual-band Transceiver IC for GSM and DCS1800 applications", IEEE 25th European Solid-State Circuits Conference, 1999, pp.278–281) for GSM, DCS1800 proposed by Takikawa et al.

As an important item in the design of the transmitter circuit, there is cited reduction in noise leakage to a receive frequency band. In the case of, for example, an European portable telephone GSM, noise in a reception band spaced apart by only 20 MHz from an upper limit of a transmission band with respect to maximum output power 33 dBm must be suppressed to be equal to or less than −79 dBm/100 kHz (−129 dBm/Hz). If a band pass filter or the like is applied to the output unit of a power amplifier, the above-described specification will be able to be achieved, but the efficiency will be reduced under the influence of lost filter. For this reason, as structure using no filter, there has been applied an offset PLL system.

Structure of a transmitter to which a conventional offset PLL system has been applied is shown in FIG. 17 (See, for example, non-patent literature 2, T. Yamawaki et al, "A 2.7-V GSM RF Transceiver IC", IEEE J. Solid-State Circuits, Dec. 1997, Vol.32, No.12, pp.2089–2096).

The transmitter is composed of an intermediate frequency (IF) signal generating unit 1703 and a PLL (Phase Locked Loop) unit 1702.

First, an operation of the IF unit will be described. To an I-signal input terminal 113, a Q-signal input terminal 114, there is inputted I, Q signal each having a band of 200 kHz. This input signal is mixed with an IF local oscillation signal 1706, 1707 having a phase difference of 90° in a mixer 117, 118.

In this case, the IF local oscillation signal is obtained by shifting the phase of output from an oscillator 1108 by 90° by a phase shifter 110. By adding the output of respective mixers, it is converted to a GMSK (Gaussian Minimum Shift Keying) modulation signal of IF frequency (270 MHz). The GMSK modulation signal is a modulation signal which has been adopted in a GSM (Global Systems for Mobile Communications) system, and has signal information only in the phase at constant amplitude. In order to provide a phase comparator 1102 in the latter stage with sufficient amplitude, the IF signal is amplified in an amplifier 1101. After a higher harmonic which occurs in the mixer 117, 118 and an amplifier 1101 is eliminated by a low-pass filter 1705, the IF signal is inputted into the phase comparator 1102 of the PLL portion 1702.

The PLL portion is characterized by including a mixer 1103, and mixes frequency 915 MHz of an output signal from a voltage control oscillator (VCO) 1104 which operates at RF frequency with a local oscillation frequency ($f_{LO}$) 1185 MHz by the mixer 1103 to thereby convert into an IF frequency (270 MHz) for outputting an error with the IF signal through the phase comparator 1102. The frequency of the error signal outputted lowers to the same base band signal band as the IQ input signal.

High-frequency noise of the error signal is suppressed by a low-pass filter (LPF) 1106. A cut-off frequency of a closed loop 1701 of the filter is about 1.6 MHz against a signal band of 200 kHz, and noise of 20 MHz is suppressed to a large extent. For this reason, noise in a band spaced apart by 20 MHz from an output signal from the VC01104 is suppressed to a large extent. Therefore, even if output from the VCO is directly connected to a power amplifier (PA) 924, it becomes possible to suppress noise to a reception band to −79 dBm/100 kHz (−129 dBm/Hz) or less without newly connecting a filter to a RF signal, and it is possible to transmit a signal of a transmission frequency ($f_{TX}$) 915 MHz through an antenna 1704.

Although the offset PLL has been broadly applied without necessitating any exterior filter for high frequency as described above, it has been difficult to apply to a modulation system in which information is included even in such a change in amplitude as HQPSK (Hybrid Quadrature Phase Shift Keying) which has been adopted in W-CDMA (Wideband CDMA (Code Division Multiple Access).

Also, it has been difficult to realize a change in signal level of 70 dB or higher which is requested in the W-CDMA.

SUMMARY OF THE INVENTION

The present invention may provide a transmitter circuit having variable width of broad output level of 70 dB or higher without necessitating any expensive exterior high-frequency filter such as SAW (Surface Acoustic Wave) which inhibits cost reduction in order to further reduce the cost and reduce a number of components. Also, the present invention may provide a transmitter and a transceiver system using the transmitter circuit.

Of the present invention to be disclosed, representative embodiments are as follows.

A transmitter circuit according to the present invention is a transmitter circuit having first and second mixers, first, second and third amplifiers, and a 90° phase shifter, wherein output terminals of the first and second mixers are connected to input terminals of the first amplifier; to local input terminals for local oscillation signals of the first and second mixers, first and second output terminals of the 90° phase shifter are connected respectively; to baseband signal input terminals of the first and second mixers, output terminals of the second and third amplifiers are connected respectively; an input terminal of the second amplifier is used as a first input terminal of the transmitter circuit; an input terminal of the third amplifier is used as a second input terminal of the transmitter circuit; an output terminal of the first amplifier is used as an output terminal for the whole; and the second and third amplifiers are provided with variable gain control.

In the above-described transmitter circuit, bias current of the first and second mixers preferably changes in proportion to an amplification factor of the second and third amplifiers.

In other words, briefly speaking, a transmitter circuit according to the present invention is constructed such that a direct conversion system is used for the transmitter circuit, there is provided variable gain means in an input portion of an orthogonal modulator and bias of the orthogonal modulator is changed in interlock with a change in gain. Thereby, it is possible to realize large variable width while a ratio of carrier leak to a transmission signal is maintained.

DETAILED DESCRIPTION OF THE PREFERRED EMBODIMENTS

Hereinafter, with reference to the accompanying drawings, the description will be made of preferred embodiment according to the present invention.

First Embodiment

With reference to FIGS. 1 to 4, the description will be made of the first embodiment of the present invention. First, the description will be made of a variable gain method with reference to FIG. 2 when the direct conversion is applied to the transmitter circuit.

Figure 2A:
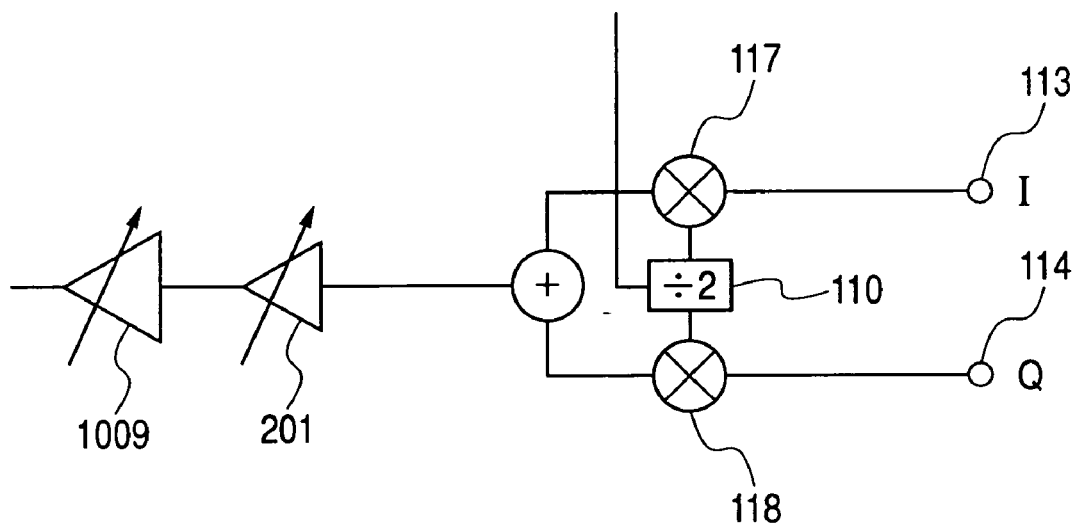
FIGS. 2A and 2B are views showing examples of circuit configuration of variable gain in the direct conversion transmitter circuit.

FIG. 2A is a view showing an example of circuit configuration when variable gain is realized by an orthogonal modulator having fixed gain and a high-frequency variable gain amplifier (RFGCA). The orthogonal modulator is composed of two mixers 117 and 118, and a divider 110 for generating two local oscillation signals having a 90° phase difference. To an I-signal input terminal 113 and a Q-signal input terminal 114, I-signal and Q-signal are applied respectively to convert into a high-frequency signal by the orthogonal modulator. The gain of the high-frequency signal converted is adjusted by a high-frequency variable gain amplifier 201.

The W-CDMA requests variable width of a signal level of 70 dB or higher. For this reason, it is necessary to change gain of 80 dB or higher including the margin by the RFGCA 201 and a power amplifier 1009. For example, it corresponds to by changing by 60 dB by the RFGCA 201 and by 20 dB by the power amplifier 1009.

Figure 2B:
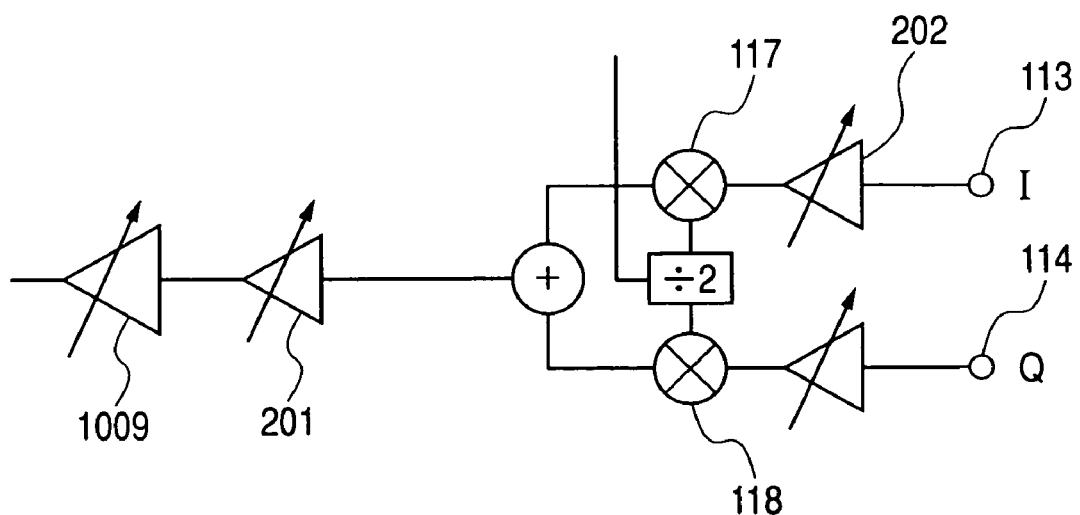

FIG. 2B shows a structural example in which an input unit of an orthogonal modulator is provided with a variable gain circuit 202. Since there has been provided a variable gain circuit 202 stage by one stage more than in FIG. 2A, gain for changing one stage becomes less, and the specification requirements of each circuit can be relieved as each side contributes to the gain instead of just one side as in FIG. 2A.

Figure 3A:
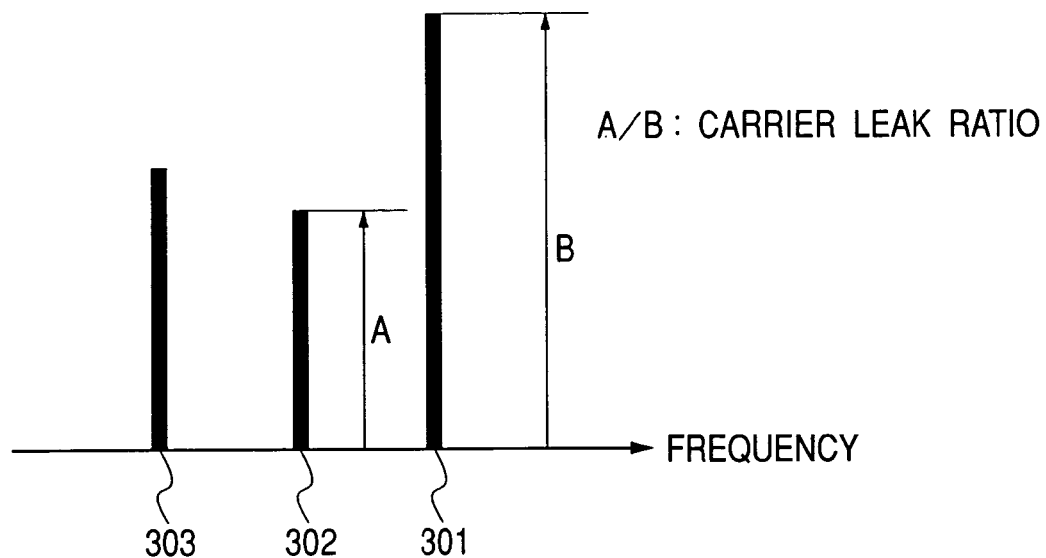
FIGS. 3A and 3B are views showing problems when an input level of an orthogonal modulator has been changed.
Figure 3B:
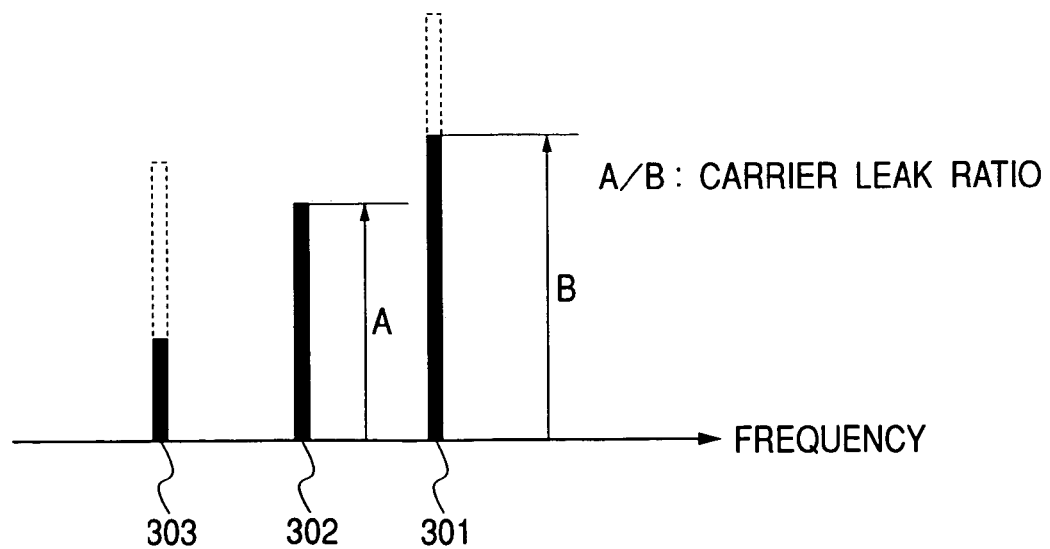

With reference to FIGS. 3A and 3B, the description will be made of the problem when the gain has been changed in the input unit of the orthogonal modulator. When there is no attenuation in the base band, that is, when there is no attenuation in the input signal level of the orthogonal modulator, as shown in FIG. 3A, in the output from the orthogonal modulator, there exist a carrier leak 302 and an image signal 303 in addition to a transmission signal 301, and the transmission signal 301 takes a sufficiently large value against the carrier leak 302 and the image signal 303. The carrier leak 302 results from an input DC offset of the mixer, and occurs by a product of the DC component and the local oscillation signal. The image signal 303 occurs when the phase of a local oscillation signal to be fed to each circuit of I and Q shifts from 90°. Either occurs because of a mismatch between a transistor and resistance characteristic which constitute the mixer.

When the base band is attenuated, that is, when the input signal level of the orthogonal modulator is lowered, since the image signal 303 is in proportion to both the input signal level and the bias current as shown in FIG. 3B, when the input signal level is lowered, the image signal level also lowers. On the other hand, the carrier leak 302 is in proportion to the input DC offset, but is not in proportion to the input signal level. For this reason, even if the input signal level is made lower, the carrier leak 302 does not decrease, but a carrier leak ratio (assuming an absolute amount of the carrier leak as A and an absolute amount of the transmission signal as B, A/B is referred to as carrier leak ratio) A/B becomes smaller than in FIG. 3A, which leads to deteriorated modulation accuracy in the modulation signal.

Figure 4:
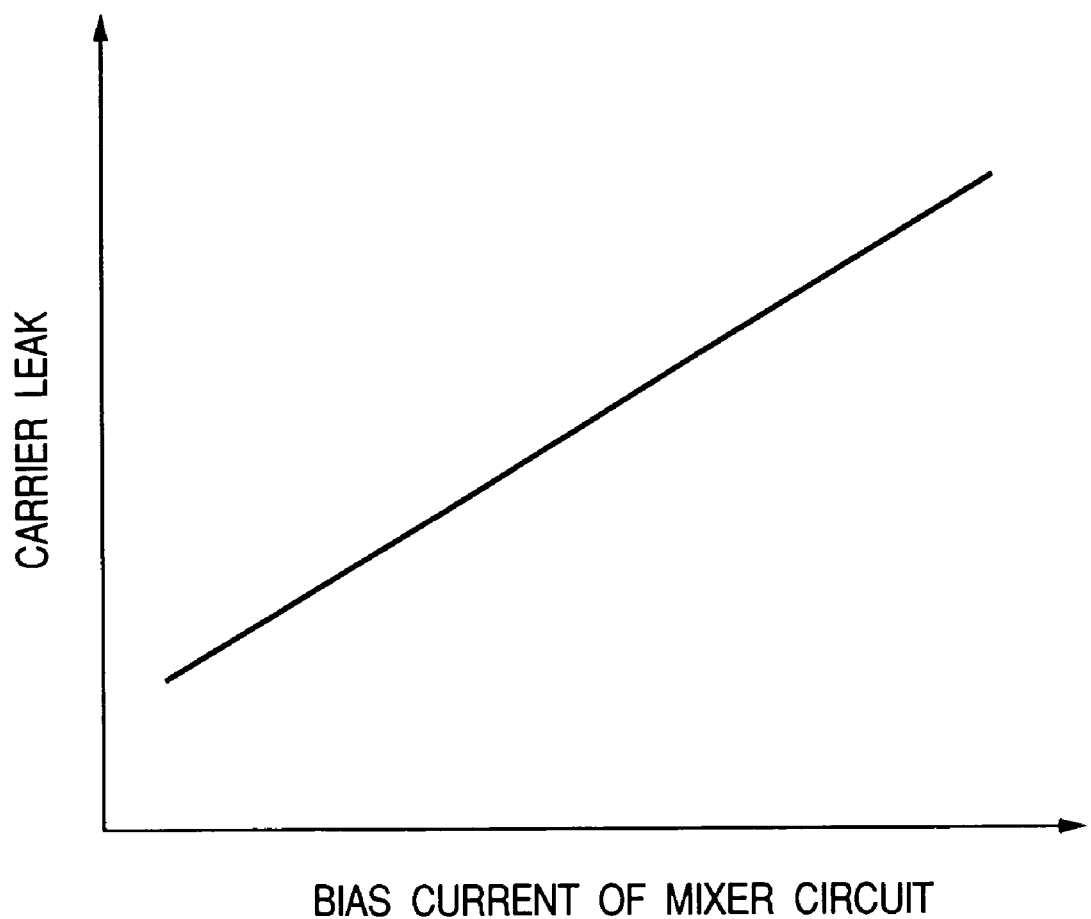
FIG. 4 is a characteristic diagram showing relationship between bias current of a mixer and carrier leak.

As regards relationship between carrier leak and bias current of mixer, since when the mixer bias current is increased, the DC offset also increases as shown in FIG. 4, the carrier leak increases. When the bias current is lowered conversely, the carrier leak decreases. Therefore, when the input level of the orthogonal modulator is lowered, it is necessary to decrease the carrier leak by reducing also the mixer bias current.

Figure 1:
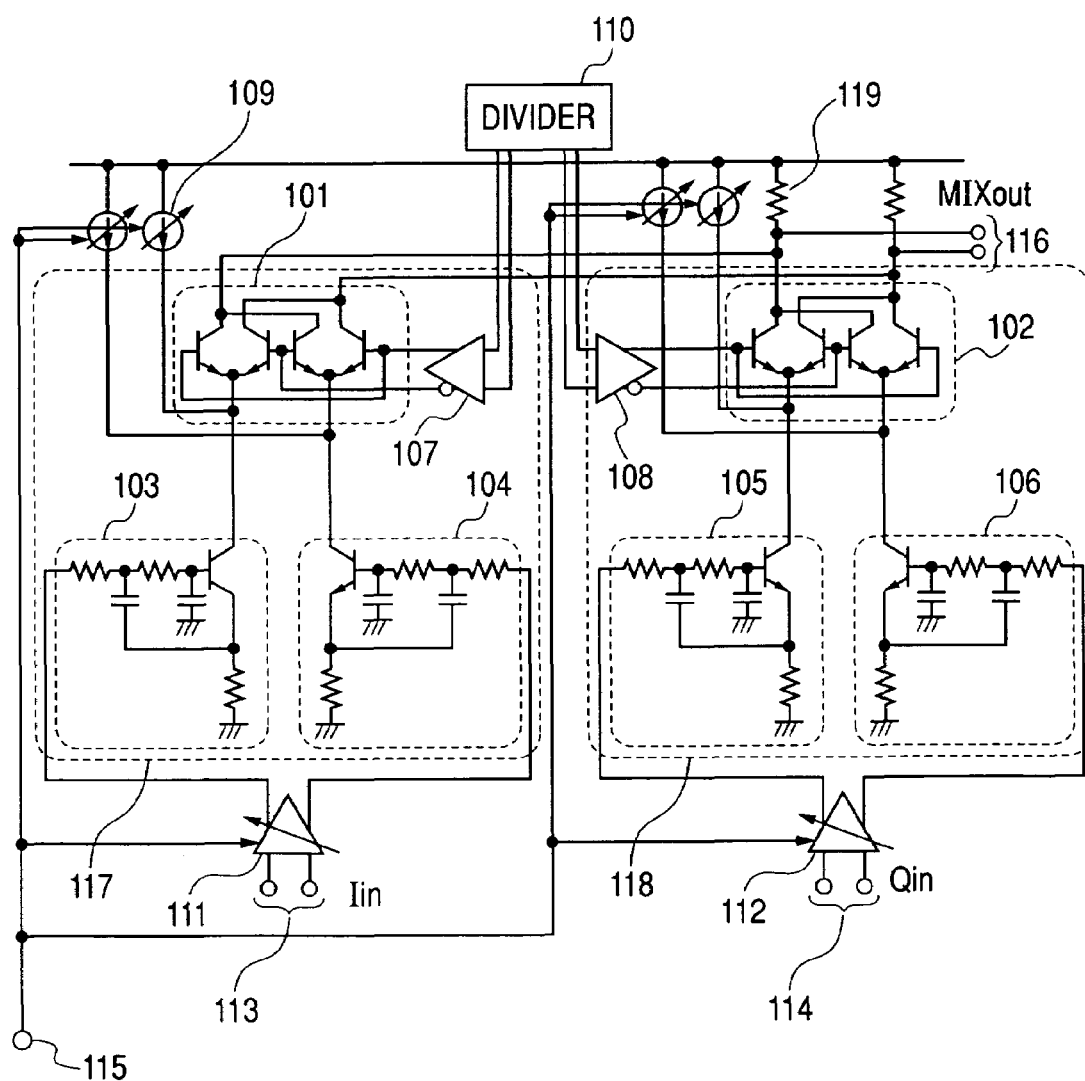
FIG. 1 is a block diagram showing a direct conversion transmitter circuit according to a first embodiment of the present invention.

FIG. 1 shows a specific example of circuit configuration which interlocks a change in input level with a change of bias level of the mixer. This circuit is composed of a mixer 117, 118 for I, Q signal, a load resistance 119 common to both mixers, a variable attenuator 111, 112 which is applied to each signal, and a divider 110. For the circuit type of the mixer, a Gilbert type mixer is used. The mixer 117, 118 is composed of a switch portion 101, 102 for switching the direction of a differential signal by means of a change in polarity of a local oscillation signal, and a voltage controlled current unit 103, 104, 105, 106. Further, the voltage controlled current unit 103 to 106 is additionally provided with a secondary filter circuit composed of capacity and resistance respectively in order to reduce the out-band noise level. One differential output of two pairs of differential output of the divider 110 is connected to input of a RF amplifier 107 for local oscillation signal within the mixer 117, and the other differential output is connected to input of a RF amplifier 108 for local oscillation signal within the mixer 118.

An operation of the circuit shown in FIG. 1 is as follows.

A signal applied to the I, Q input terminal 113, 114 is adjusted to an appropriate signal level by means of the variable attenuator 111, 112. An attenuation level of the variable attenuator is determined by a DC signal level to be applied to a gain control terminal 115. When a gain control signal controls the attenuation level of the variable attenuator, and at the same time, an amount of current of a bias current source 109 for controlling a bias current level of the mixer 117, 118 is increased, DC bias which flows through the switch unit 101, 102 is reduced to reduce carrier leak of the mixer. For this reason, when a modulation signal MIX$_{out}$ to be outputted from the output terminal 116 becomes small, the carrier leak is also to be reduced at the same time.

According to the present embodiment, it has become possible to apply a variable gain circuit to an input unit of the orthogonal modulator without deteriorating a ratio of a signal to the carrier leak level.

<Second Embodiment>

With reference to FIG. 5 to FIGS. 7A and 7B, the description will be made of a second embodiment according to the present invention. Although the current source which interlocks with the variable attenuator has been used in the first embodiment, in the present embodiment, bias of the mixer will be controlled by means of common mode DC voltage of the variable attenuator.

Figure 5:
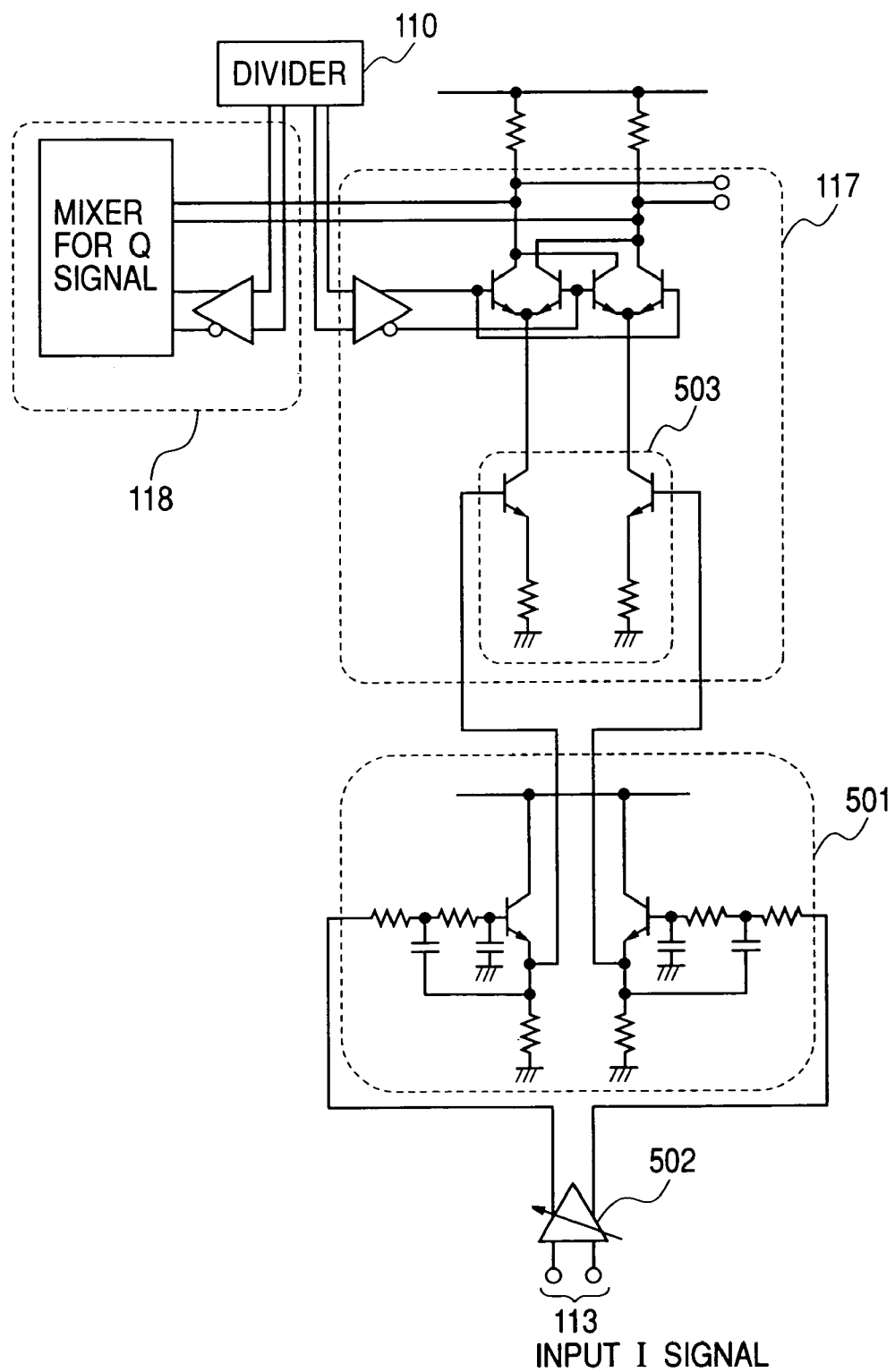
FIG. 5 is a block diagram showing a direct conversion transmitter circuit according to a second embodiment of the present invention.

FIG. 5 shows circuit configuration of the present embodiment. Since I, Q both systems have the same configuration, detailed circuit configuration only concerning the I-system will be shown and the circuit configuration of the Q-system will be omitted hereinafter.

As in the case of the first embodiment, for the mixer 117, a Gilbert type mixer is applied, and the mixer 117 is driven by a secondary active filter circuit 501 for reducing an out-band noise level. The active filter circuit 501 is driven by a variable attenuator 502. The variable attenuator 502 attenuates a signal level, and also changes a DC level of the output. It does not change a bias level in a differential direction of differential output, but in the in-phase direction. This changes in-phase bias of a voltage controlled current circuit 503 of the mixer to control an amount of carrier leak to be generated from the mixer.

Figure 6:
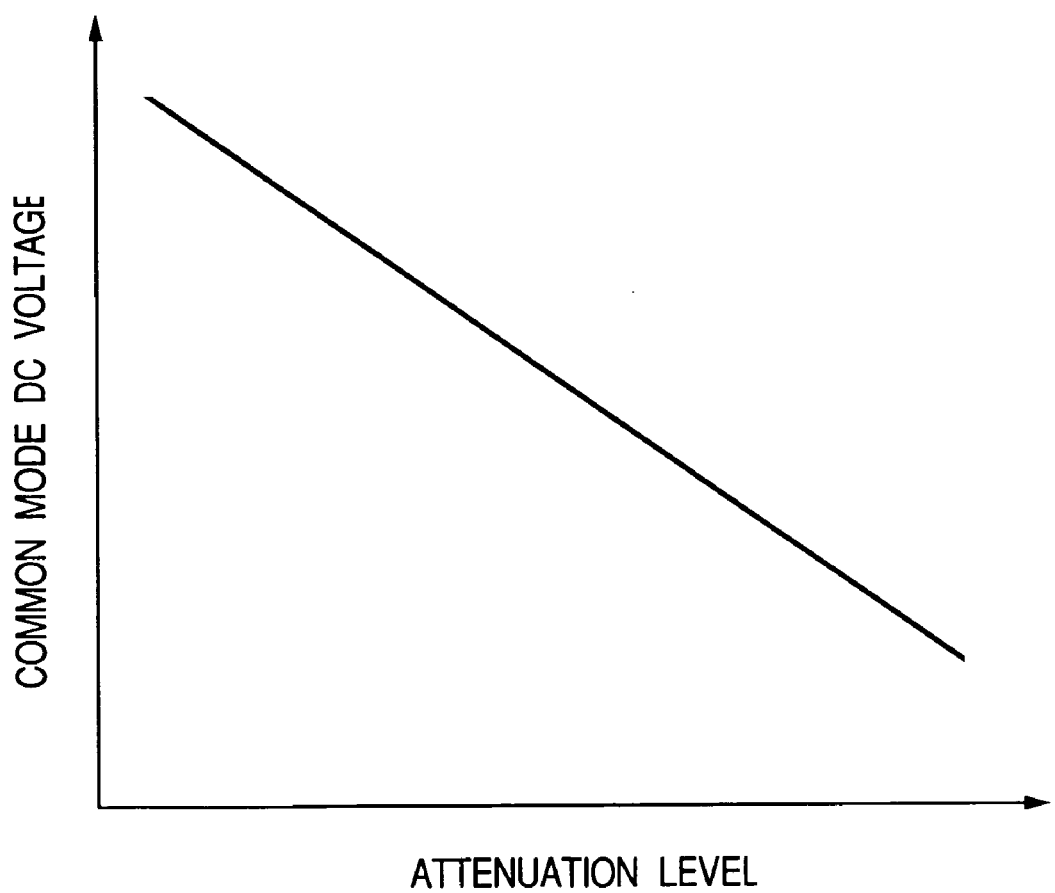
FIG. 6 is a view showing relationship between an attenuation level of an attenuator unit to be used in FIG. 5 and a common mode DC voltage.

FIG. 6 shows relationship between the attenuation level of signal level and bias level. When the attenuation level of signal level is increased, the DC bias level is lowered and an amount of occurrence of carrier leak is reduced.

Figure 7A:
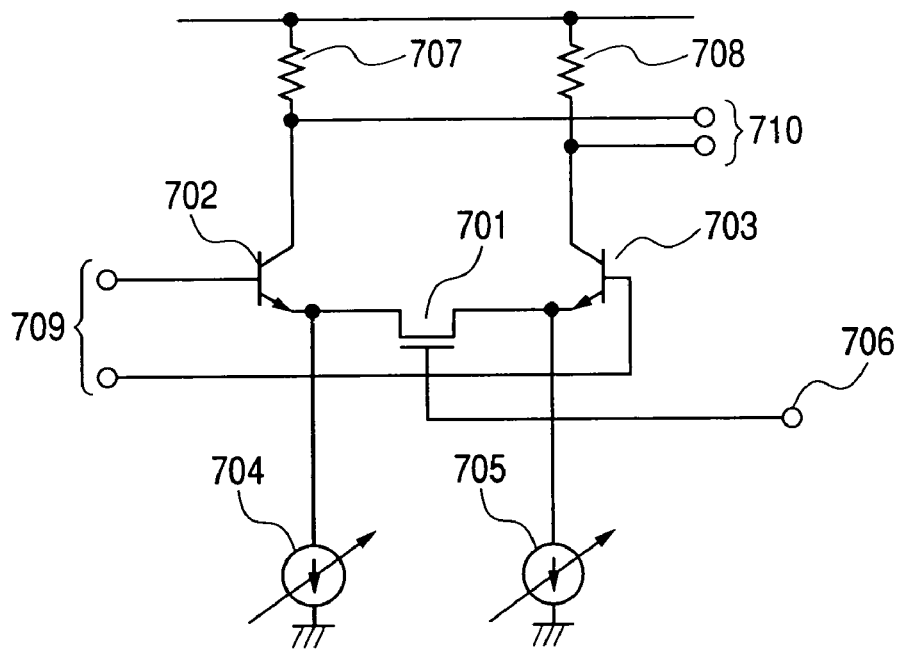
FIGS. 7A and 7B are a circuit block diagram and a characteristic diagram, respectively, showing the relationship between On-resistance of a FET for constituting the circuit and bias current, and showing a specific example of the attenuator which may be used in FIG. 5.

FIG. 7A shows specific circuit configuration of a variable attenuator 502 which is applied in the present embodiment. A differential pair is constituted by transistors 702 and 703, and the respective bases serve as an input terminal 709. Between emitters of the transistor, there is connected a field effect transistor (FET) 701 which performs the function of the variable resistance. Voltage to be applied to a gate bias terminal 706 of the FET 701 controls On-resistance of the FET to control the attenuation level of the variable attenuator 502 which operates as the voltage controlled current source. By means of load resistance 707, 708, a current signal is outputted to an output terminal 710 as voltage information to drive an active filter circuit at the next stage. The bias level of the output is realized by changing driving current of a current source 704, 705 to adjust an amount of fall-of-potential at load resistance 707, 708.

Figure 7B:
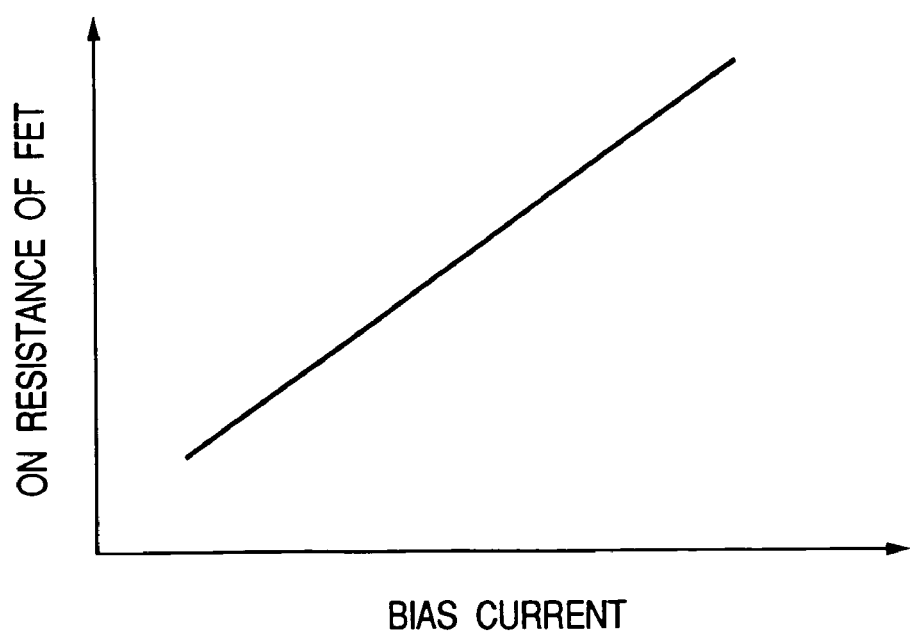

FIG. 7B shows relationship between a bias current level and On-resistance of FET. When the On-resistance is low, an operating current of the mixer must be large because the attenuation level is low and the signal level is high. For this reason, it is necessary to reduce the fall-of-potential at the resistance, and bias current of the variable attenuator will be reduced. When the On-resistance is high, the attenuation level is high, and in order to suppress carrier leak, it is necessary to reduce the bias current of the mixer. For this reason, the output potential must be lowered, and the bias current of the variable attenuator will be increased.

With the structure of the present embodiment, the bias level of the mixer is changed in response to the input signal level to thereby be able to maintain appropriate output signal and carrier leak ratio.

Third Embodiment

Figure 8:
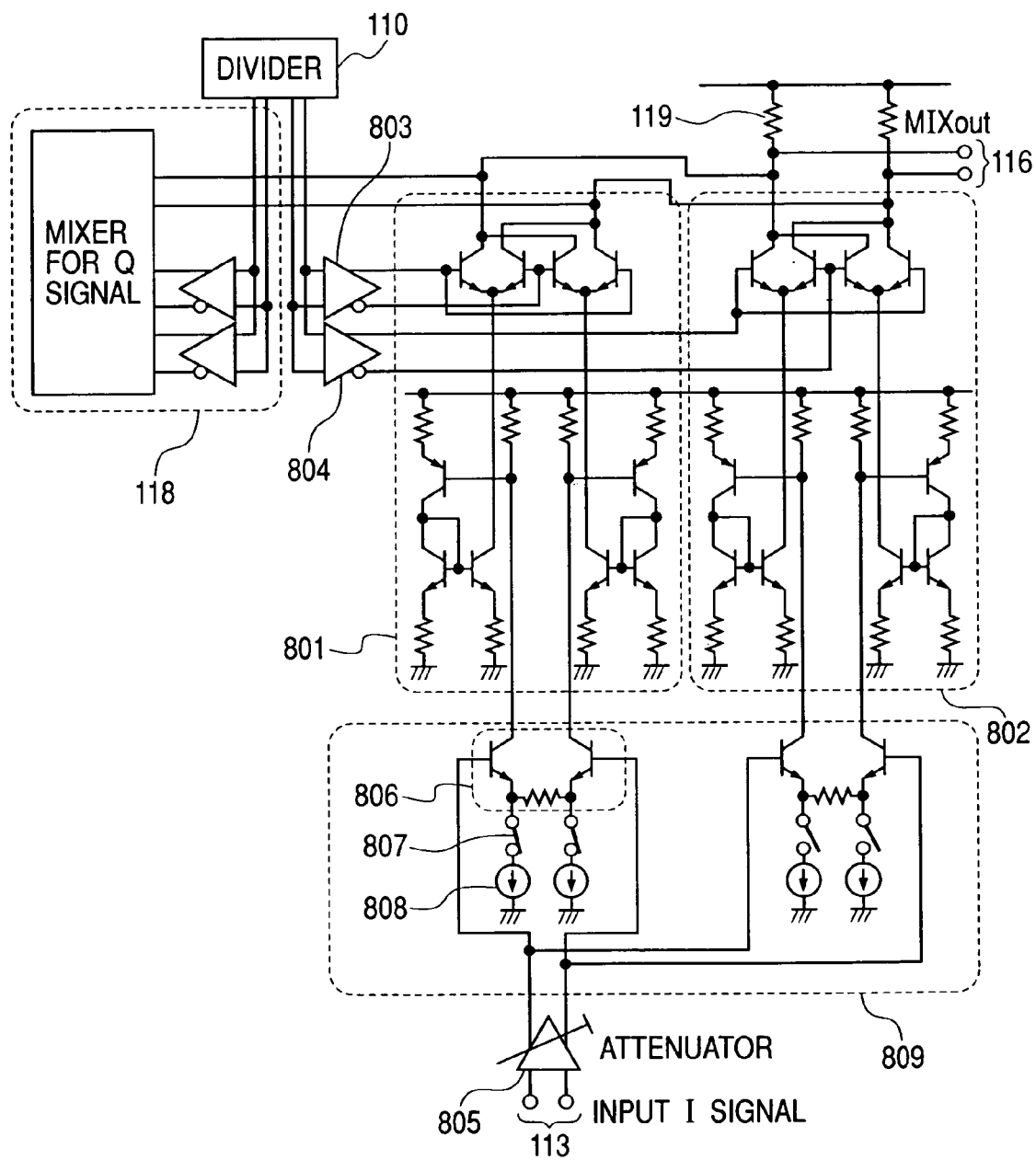
FIG. 8 is a block diagram showing a direct conversion transmitter circuit according to a third embodiment of the present invention.

With reference to FIG. 8, the description will be made of a third embodiment of the present invention. In the present embodiment, mixers responsive to the signal level are connected in parallel, and are used by switching in accordance with the signal level, whereby it is possible to cope with reduction in carrier leak. FIG. 8 shows when two mixers 801 and 802 are connected in parallel. The mixer 801 is a high gain circuit, while the mixer 802 is a low gain circuit. The mixers 801 and 802 are constituted with size of transistor for constituting the circuit as n:1, and resistance as 1:n, and are set such that the driving current becomes n:1 at the same bias voltage. Even buffer circuits 803 and 804 for driving two mixer circuits are realized with similar transistor size ratio and resistance ratio.

These two mixers 801 and 802 are selected by an input circuit 809 at the previous stage. The input circuit is constituted by a plurality of selection circuits, each being composed of a differential pair 805, a switch 807 and a current source 808. The mixers are selected by switching ON or OFF. In the present embodiment, there are three operation modes: a simultaneous operation of the mixers 801 and 802, a single operation of the mixer 801 and a single operation of the mixer 802. The operation mode is selected in accordance with the attenuation level of the variable attenuator 805 to make it possible to optimize the amount of carrier leak.

<Fourth Embodiment>

Figure 9:
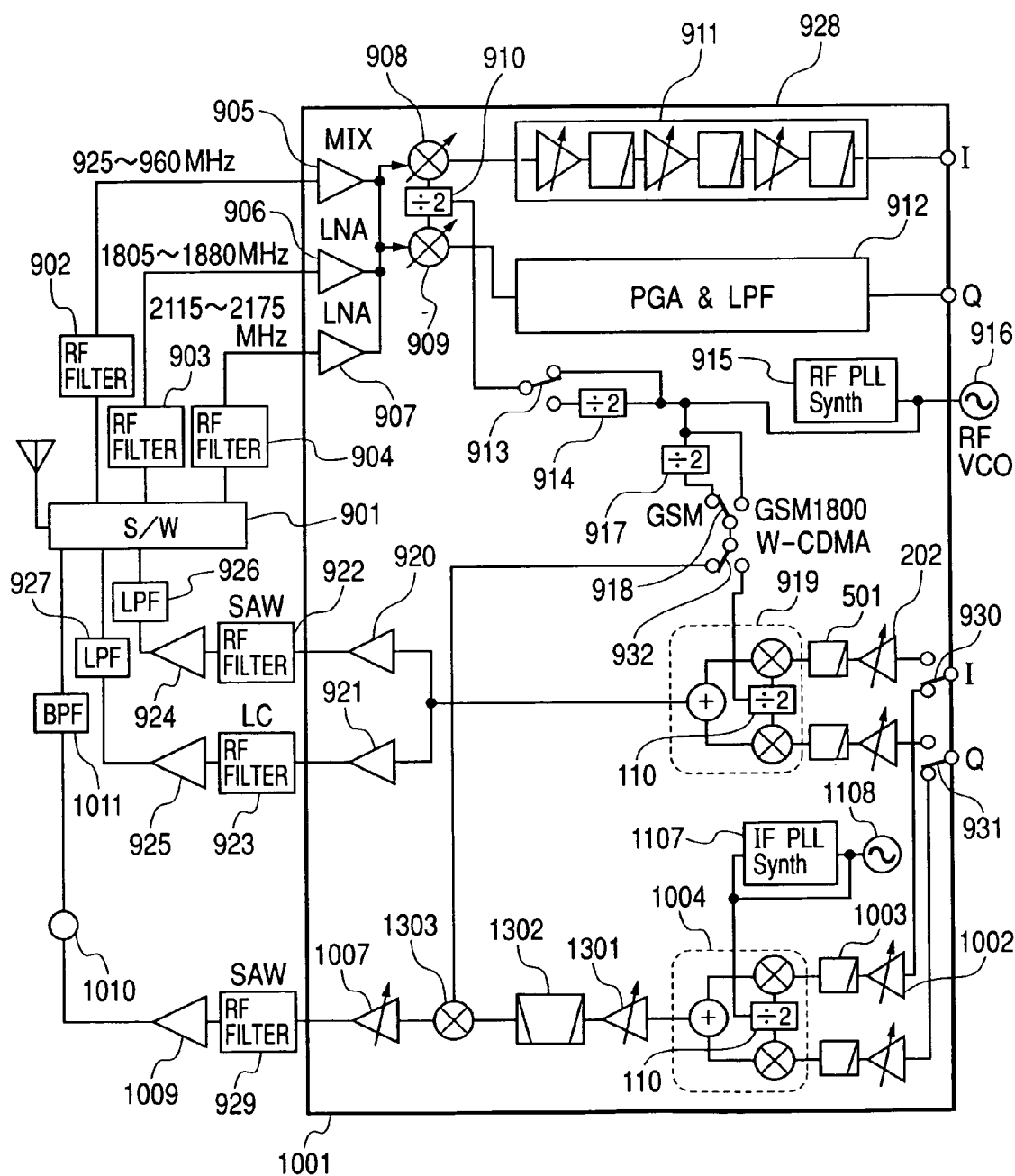
FIG. 9 is a block diagram showing a transceiver circuit according to a fourth embodiment of the present invention.
Figure 13:
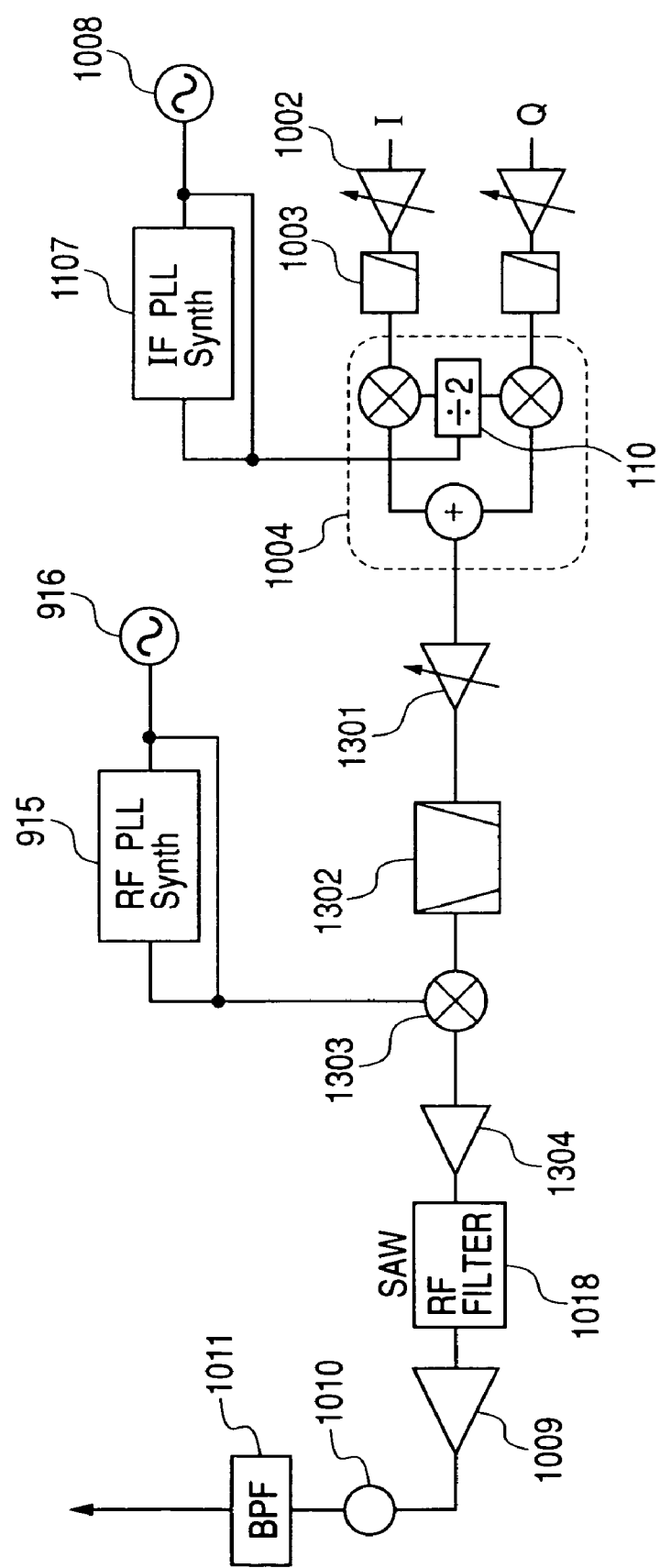
FIG. 13 is a block diagram showing a transmitter circuit according to a fourth embodiment of the present invention.

With reference to FIGS. 9 and 13, the description will be made of a fourth embodiment of the present invention. In the embodiments shown so far, the output from the orthogonal modulator has been in a high-frequency signal, but in the present embodiment, it is converted into an intermediate frequency signal.

First, with reference to FIG. 13, the description will be made of an operation of the transmitter circuit. I, Q signal is converted into an appropriate level by a variable attenuator 1002, and after out-band noise is removed by a low pass filter 1003, is inputted into an orthogonal modulator 1004. To the orthogonal modulator, there is applied an oscillation signal of an intermediate frequency voltage control oscillator 1008 to be controlled by an intermediate frequency synthesizer (IF PLL Synth) 1107, and output from the orthogonal modulator 1004 is converted into an intermediate frequency of 190 MHz. 190 MHz corresponds to an interval between transmission and reception signals of W-CDMA.

The intermediate frequency signal is adjusted to an adequate signal level by a variable gain amplifier 1301, and after it passes through a band pass filter 1302 for removing noise, which leaks into the reception band and is 190 MHz apart, is converted into a high frequency signal by the mixer 1303 through the use of an oscillation signal of a voltage control oscillator 916 to be controlled by a high frequency synthesizer (RF PLL Synth) 915.

The signal after the conversion is amplified by a high frequency amplifier 1304, higher harmonics and 190 MHz detuning noise are removed by a band pass filter 1018 composed of SAW and the like, is amplified by a power amplifier 1009, there is interposed an isolator 1010 for making the load impedance of the amplifier 1009 constant, and the higher harmonics and 190 MHz detuning noise are suppressed by a band pass filter 1011 again, and thereafter is outputted through an antenna.

With reference to FIG. 9, the description will be made of the present embodiment as a dual-mode transceiver circuit of GSM and W-CDMA. For the reception circuit, the direct conversion circuit has been applied. The reception circuit has three systems: GSM, GSM1800 and W-CDMA.

A reception signal inputted through the antenna is distributed by a switch 901, and thereafter, a disturbing wave is removed with an input high-frequency band pass filter 902, 903, 904. After it is amplified by a low noise amplifier 905, 906, 907, the signal is converted into a base band I, Q signal by a mixer 908, 909. Local oscillation signals of two mixers 908 and 909 having a 90° phase difference are produced by a divider 910.

When receiving a GSM signal, a voltage control oscillator 916 to be controlled by the high frequency synthesizer 915 oscillates at 3700 MHz to 3840 MHz, and the signal thus obtained is converted into a signal of 1850 MHz to 1920 MHz by a divider 914 selected by a switch 913. This divided signal is further divided by a divider 910, and is applied to a mixer 908, 909 as a local oscillation signal of 925 MHz to 960 MHz. In a base band output signal of the mixer, a disturbing wave is removed with a circuit (PGA & LOF) 911, 912 in which a variable gain amplifier (PGA) and a low band pass filter (LPF) have been alternately connected, and the signal is amplified into an adequate signal level to be outputted as I, Q output signal.

When receiving a GSM1800 signal, the voltage control oscillator 916 oscillates at 3610 MHz to 3760 MHz, and the signal thus obtained is directly inputted into a divider 910 by bypassing a divider 914 by means of a switch 913. Thereby, a local oscillation signal of 1805 MHz to 1880 MHz is applied to a mixer 908, 909.

When receiving a W-CDMA signal, the voltage control oscillator 916 oscillates at 4230 MHz to 4350 MHz, the divider 914 is bypassed by a switch 913, and the signal thus obtained is directly inputted into a divider 910. Thereby, a local oscillation signal of 2115 MHz to 2175 MHz is applied to a mixer 908, 909. I, Q signal band of GSM is of 135 kHz, whereas that of W-CDMA is of 1.98 MHz. For this reason, when receiving the W-CDMA signal, it is necessary to cope with by switching a time constant of the filter.

A communication system of GSM and GSM1800 is TDMA (Time Division Multiple Access), in which transmission and reception are not performed at the same time, but transmission and reception are surely alternately performed. When transmitting a GSM signal, a GSM circuit is selected by a switch 930, 931, I, Q signal is attenuated to an adequate signal level by a variable attenuator 202, and after out-band noise is removed by a low-pass filter 501, is applied to an orthogonal modulator 919. The voltage control oscillator 916 oscillates at 3520 MHz to 3660 MHz, and the signal thus obtained is converted into a signal of 1760 MHz to 1830 MHz by a divider 917 selected by a switch 918. This divided signal is further divided by a divider 110, and is applied to the mixer as a local oscillation signal of 880 MHz to 915 MHz.

A transmission signal of 880 MHz to 915 MHz is amplified by a high-frequency amplifier 920, higher harmonics and 20 MHz-apart receiving band noise are removed by a high-frequency band pass filter composed of SAW and the like, and the signal is amplified by a power amplifier 924. Thus, after higher harmonics are removed by a low pass filter (LPF) 926, the signal is transmitted from the antenna through a switch 901.

When transmitting a GSM1800 signal, the GSM circuit is selected by a switch 930, 931, I, Q signal is attenuated to an adequate signal level by an attenuator, and after out-band noise is removed by a low pass filter 501, is applied to the orthogonal modulator 919. The voltage control oscillator 916 oscillates at 3420 MHz to 3570 MHz, a divider 917 is bypassed by a switch 918, and the signal thus obtained is directly inputted into a divider 910. This signal is divided by the divider 110, and is applied to the mixer as a local oscillation signal of 1710 MHz to 1785 MHz. The transmission signal of 1710 MHz to 1785 MHz is amplified by a high-frequency amplifier 921, high harmonics are removed by a high-frequency band pass filter composed of IC and the like, and a signal thus obtained is amplified by a power amplifier 925. After higher harmonics are removed by a low pass filter 927, the signal is transmitted from the antenna through a switch 901.

When transmitting a W-CDMA signal, a signal is received at the same time unlike in the case of the GSM. The W-CDMA circuit is selected by the switch 930, 931, I, Q signal is attenuated to an adequate signal level by a variable attenuator 1002, and after out-band noise is removed by a low-pass filter 1003, is applied to an orthogonal modulator 1004. The voltage control oscillator 916 oscillates at 4230 MHz to 4350 MHz, the divider 917 is selected by a switch 918, and the signal thus obtained is converted into a signal of 2115 MHz to 2175 MHz by a divider 917 to be applied to a mixer circuit 1303. As explained in FIG. 13, a center frequency of an output signal from the orthogonal modulator 1004 is 190 MHz. By multiplying an intermediate frequency signal of 190 MHz by a local oscillation signal of 2115 MHz to 2175 MHz, a transmission signal of 1925 MHz to 1985 MHz is obtained.

In the present embodiment, a transceiver circuit 928 can be constituted by one chip, and it becomes possible to realize a transceiver circuit which corresponds to both systems of GSM/W-CDMA.

<Fifth Embodiment>

Figure 10:
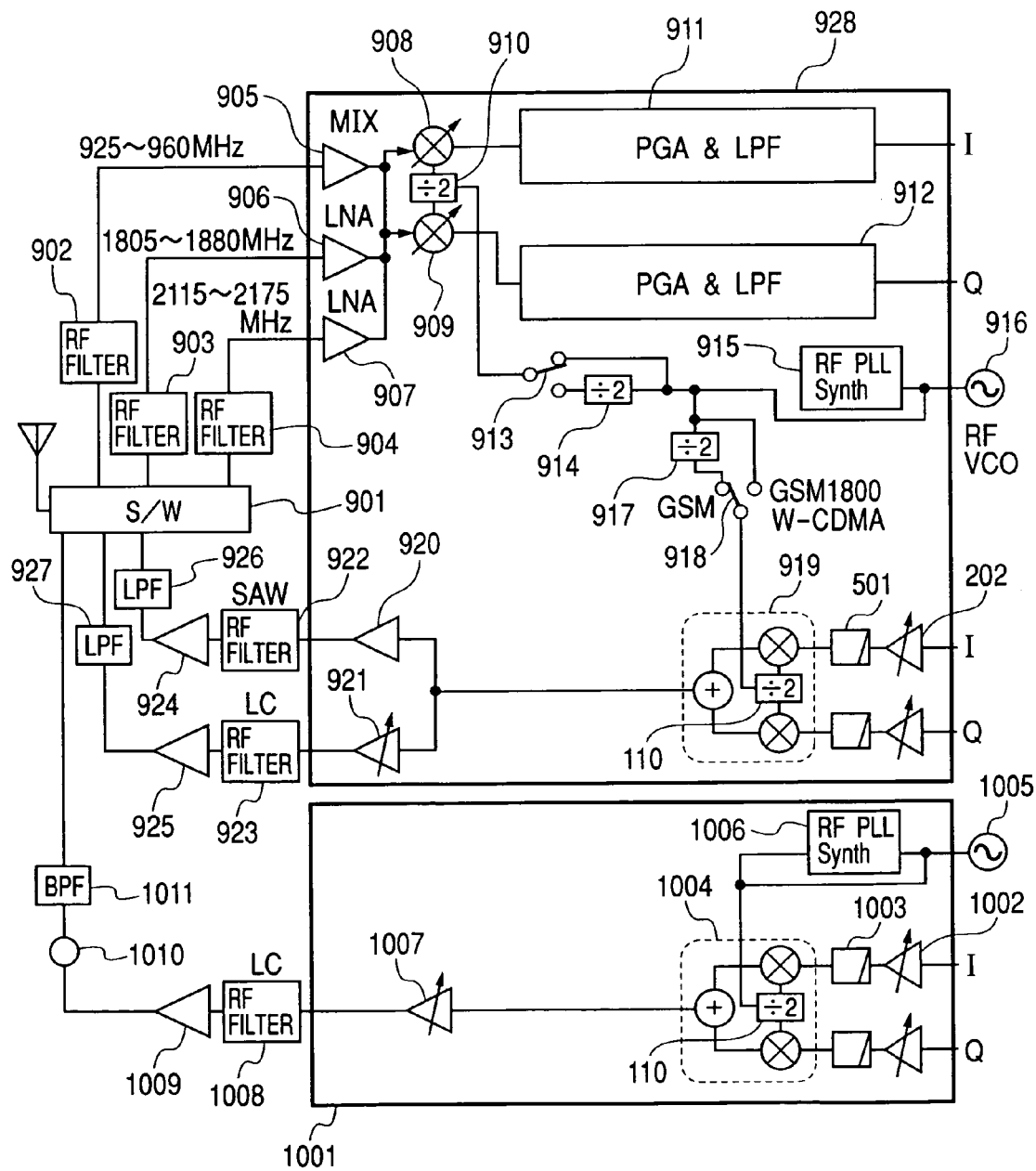
FIG. 10 is a block diagram showing an entire transceiver circuit according to a fifth embodiment of the present invention.
Figure 11:
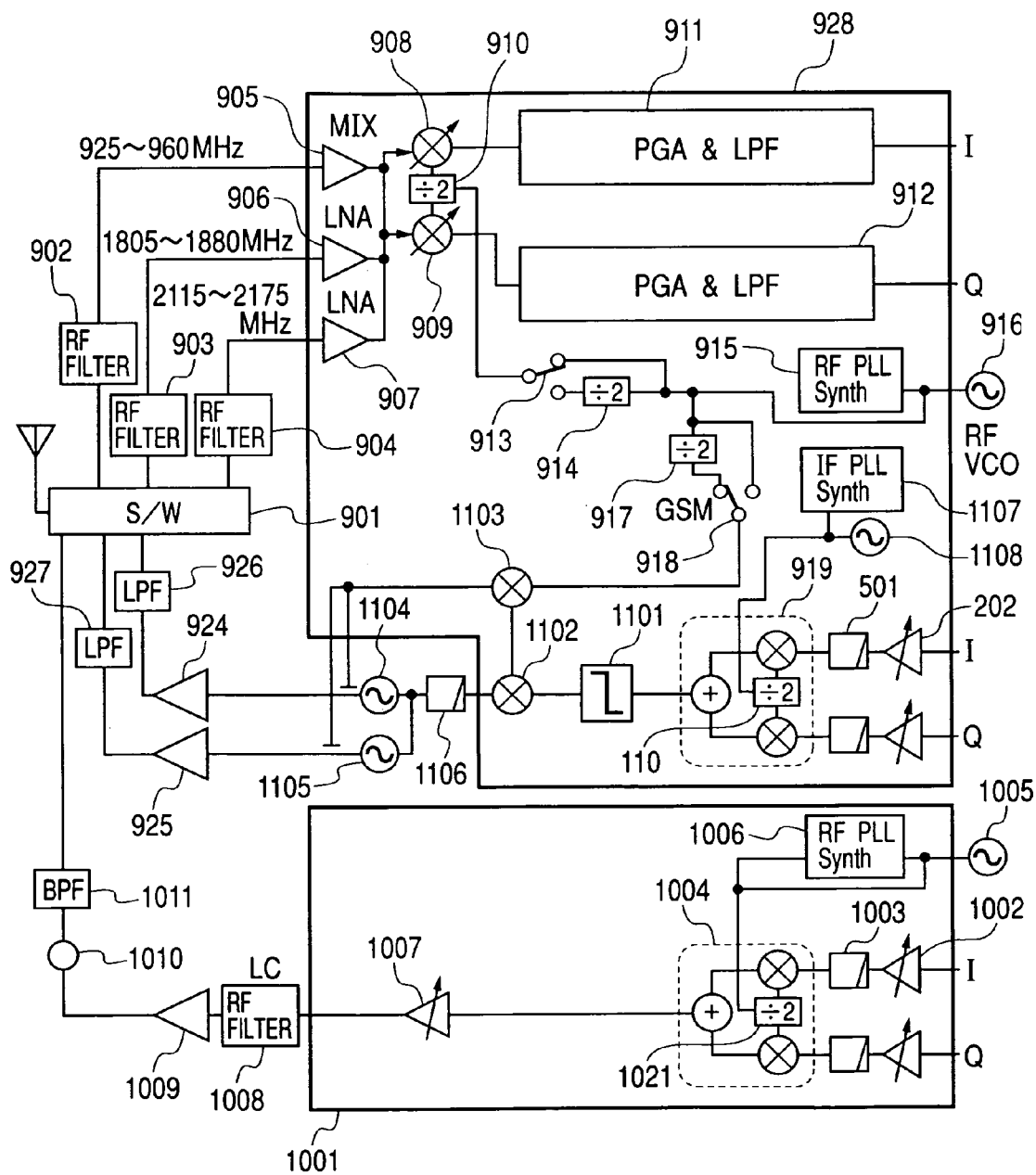
FIG. 11 is a circuit block diagram when an offset PLL circuit has been applied to a GSM transmission unit of a transceiver circuit according to the fifth embodiment of the present invention.
Figure 12:
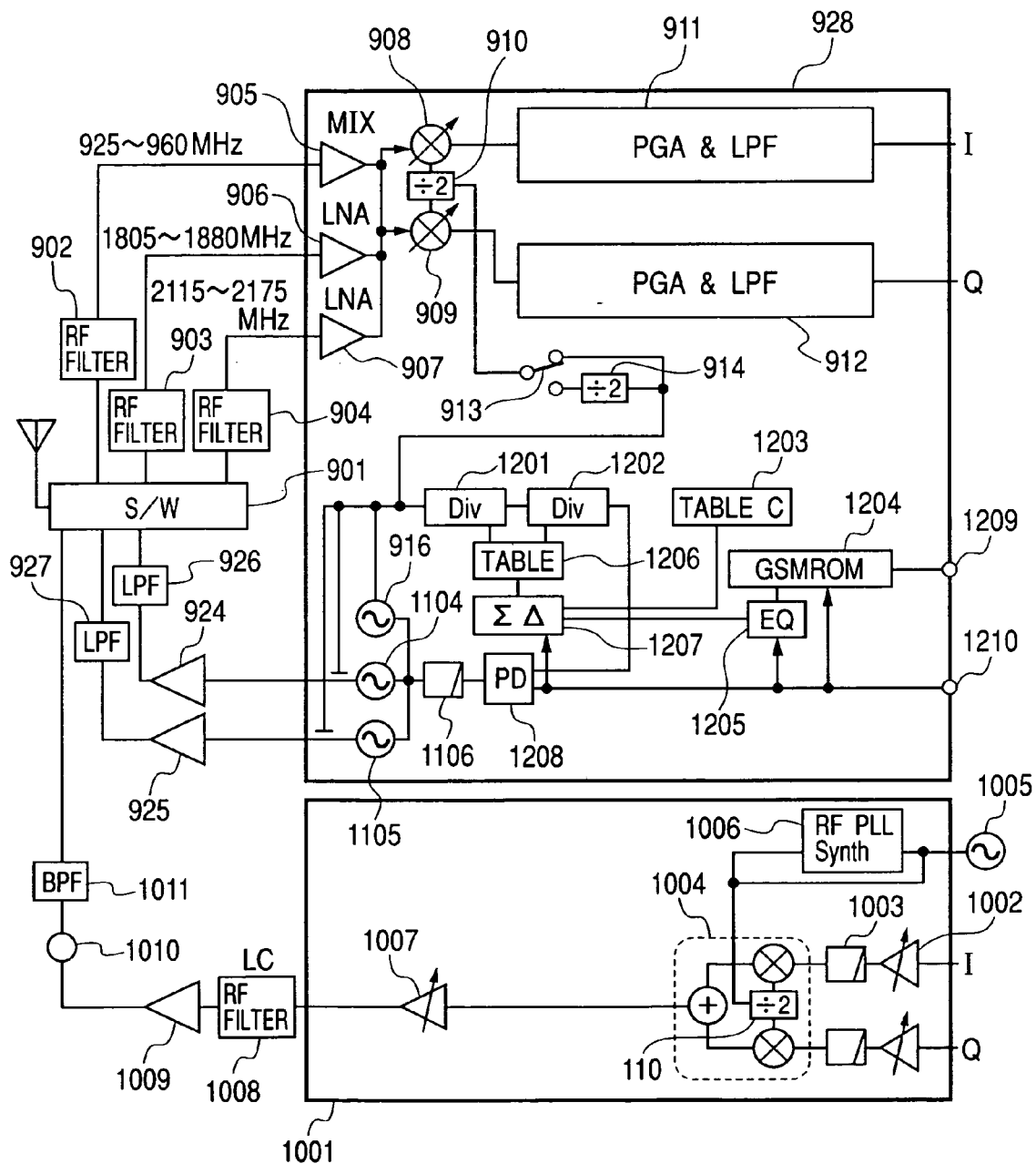
FIG. 12 is a circuit block diagram when a fractional synthesizer has been applied to a GSM transmission unit of a transceiver circuit according to the fifth embodiment of the present invention.

With reference to FIGS. 10 to 12, the description will be made of a fifth embodiment according to the present invention. In the present embodiment, the W-CDMA transmitter circuit is constituted by the direct conversion circuit, and is realized by an independent integrated circuit chip 1001. According to the standard of W-CDMA, the frequency interval of transmission and reception is not fixed at 190 MHz, but is allowed to be changed. The present embodiment is capable of flexibly coping with even in such a case.

In the circuit configuration shown in FIG. 10, the description will be omitted during the operation of the GSM and GSM1800 system because it is the same as the fourth embodiment. The W-CDMA transmitter circuit is composed of the direct conversion circuit, a high-frequency synthesizer 1006 and an oscillator 1005. During an operation of the W-CDMA, the reception system performs the same operation as the fourth embodiment. An oscillator 1005 of the transmission system oscillates at 3850 MHz to 3970 MHz, and this signal is converted into a local oscillation signal of 1925 MHz to 1985 MHz by a divider 1012. I, Q signal is converted into an adequate signal level by a variable attenuator 1002, and thereafter, is applied to the orthogonal modulator 1004 through the low-pass filter 1003 for removing out-band noise. An output signal from the orthogonal modulator is 1925 MHz to 1985 MHz, and after level adjustment by a variable gain high-frequency amplifier 1007, higher harmonics are removed by a LC filter 1008. After amplified by the power amplifier 1009, the signal is to outputted from the antenna through an isolator 1010, the band pass filter 1011 and the switch 901.

FIG. 11 shows an example when the transmission unit of GSM has been constituted by the offset PLL circuit which has been conventionally applied. For this reason, the structure of FIG. 10 is changed such that there is provided an intermediate frequency synthesizer 1107 and this intermediate frequency signal is inputted into a divider of the orthogonal modulator 919. Also, the structure is arranged such that between output of the orthogonal modulator 919 of FIG. 10 and the amplifier, 924, 925, there is provided a limiter 1101 and the output from the orthogonal modulator 919 is applied to a loop filter 1106 through a phase comparator 1102 for comparing the output from this limiter with output from the mixer 1103 in phase. By means of the limiter 1101, output amplitude of the offset PLL circuit composed of a voltage control oscillator 1104 for GSM, a voltage control oscillator 1105 for GSM1800, the mixer 1103, the phase comparator 1102 and the loop filter 1106, and the orthogonal modulator 919 will be restricted constant.

In the case of the GSM, to the mixer 1103, there are inputted a signal which has been converted into a signal of 1760 MHz to 1830 MHz in a divider 917 selected by a switch 918, and a detection signal of output from the voltage control oscillator 1104 for GSM. The output from the loop filter 1106 is applied to an amplifier 924 for GSM through the voltage control oscillator 1104 for GSM.

On the other hand, in the case of the GASM1800, a signal which has bypassed the divider 917 by the switch 918 and a detection signal of output from the voltage control oscillator 1105 for GSM1800 are inputted into the mixer 1103. Output from the loop filter 1106 is applied to the amplifier 925 for GSM1800 through the voltage control oscillator 1105 for GSM1800.

By applying the offset PLL having such structure, a difference occurs in the oscillation frequency band of an oscillator as compared with the case of FIG. 10. During GMS transmission, 45 MHz is used as an IF signal while during GSM1800 transmission, 95 MHz is used as an IF signal. In this case, the oscillator 916 can oscillate at the same frequency band as during reception.

FIG. 12 shows when a $\Delta\Sigma$ system fractional N-type synthesizer has been used for a transmission unit of the GSM. This is a structural example in which the high-frequency synthesizer 915 in FIGS. 10 and 11 serves dually as a transmitter circuit.

For the oscillator, there are used three types: an oscillator 916 for local oscillation signal during reception, an oscillator 1104 for GSM transmission, and an oscillator 1105 for GSM1800 transmission. A synthesizer unit is composed of a high-frequency divider 1201, a low-frequency divider 1202, a channel-selecting code table (Table C) 1203, a $\Sigma\Delta$ modulator 1207, a divider-corresponding table 1206, a phase comparator 1208 and the like.

The fractional N-type synthesizer operates 1/N demultiply and 1/(N+1) demultiply with a pseudo random number having an appropriate probability to realize demultiply which is not an integer ratio between two demultiply ratios. By means of the channel-selecting code and the $\Sigma\Delta$ modulator, this pseudo random number is produced. In the present embodiment, there is used a method for further superimposing a GMSK modulation signal on the $\Sigma\Delta$ modulator 1207 to produce a GMSK signal from the synthesizer.

In this case, instead of I, Q signal, there is provided a binary data input terminal 1209, and a GMSK signal is composed by a ROM1204 in which a GMSK waveform has been stored and the binary data to apply modulation to the oscillator. Since a loop band to be determined by a voltage-frequency response characteristic, and the like of the loop filter 1106 and the oscillator 916 is narrower than the band (135 kHz) of the GMSK signal, correction has been made by an equalizing circuit (EQ) 1205. This transmitter circuit operates as a synthesizer with modulation function during transmission of GSM and GSM1800, and during reception, operates as a synthesizer for a local oscillation signal.

Either of examples shown in FIGS. 11 and 12 performs the same operation as the example shown in FIG. 10 during the operation of W-CDMA. The present embodiment is capable of coping with even when the interval between transmission and reception of the W-CDMA changes, and realizing a transceiver circuit in which a number of exterior components has been reduced.

<Sixth Embodiment>

Figure 14:
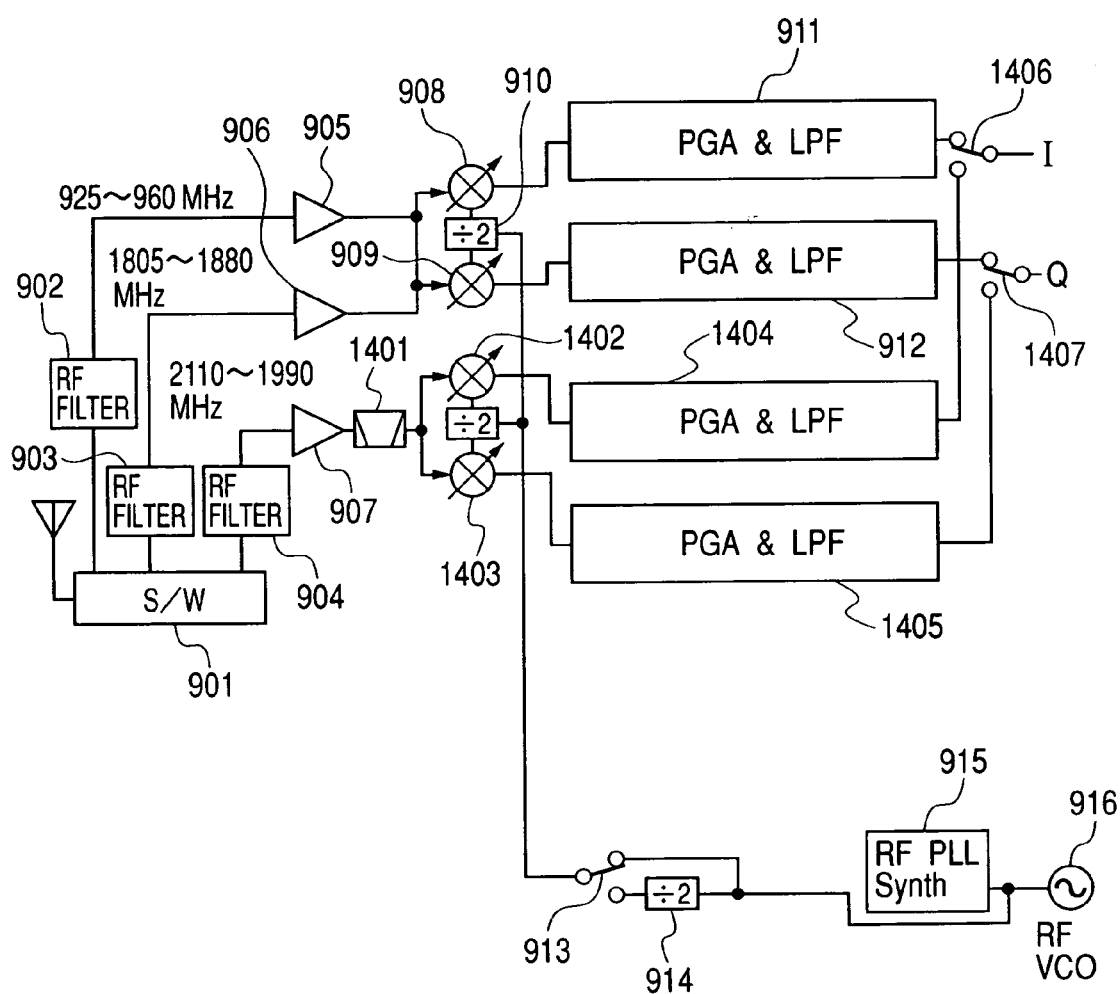
FIG. 14 is a block diagram showing a reception circuit according to a sixth embodiment of the present invention.

With reference to FIG. 14, the description will be made of a sixth embodiment according to the present invention. In the present embodiment, the details of the reception circuit are described. During the operation of W-CDMA, both transmitter circuit and reception circuit operate at the same time. For this reason, the transmission signal itself becomes the maximum disturbing wave, and high linear property is required for the reception circuit. Here, between the low noise amplifier of the W-CDMA and the mixer, there is inserted an exterior high-frequency filter 1401 whereby the transmission signal is suppressed to relieve the specification of excessive linear property.

Also, the GSM and the GSM1800 perform transmission and reception intermittently, whereas the W-CDMA always continues the transmission and reception state during a call. Therefore, the DC offset removal algorithms which are applied to two standards differ. For this reason, the structure is arranged such that there are provided a row (PGA & LPF) 911, 912 of a variable gain amplifier and a low-pass filter which are for the exclusive use of the GSM, and a row 1404, 1405 of a variable gain amplifier and a low-pass filter which are for the exclusive use of the W-CDMA and a signal is outputted from I, Q output terminal in common by a switch 1406, 1407. According to the present embodiment, it is possible to realize a reception circuit optimized for both GSM and W-CDMA systems.

<Seventh Embodiment>

Figure 15:
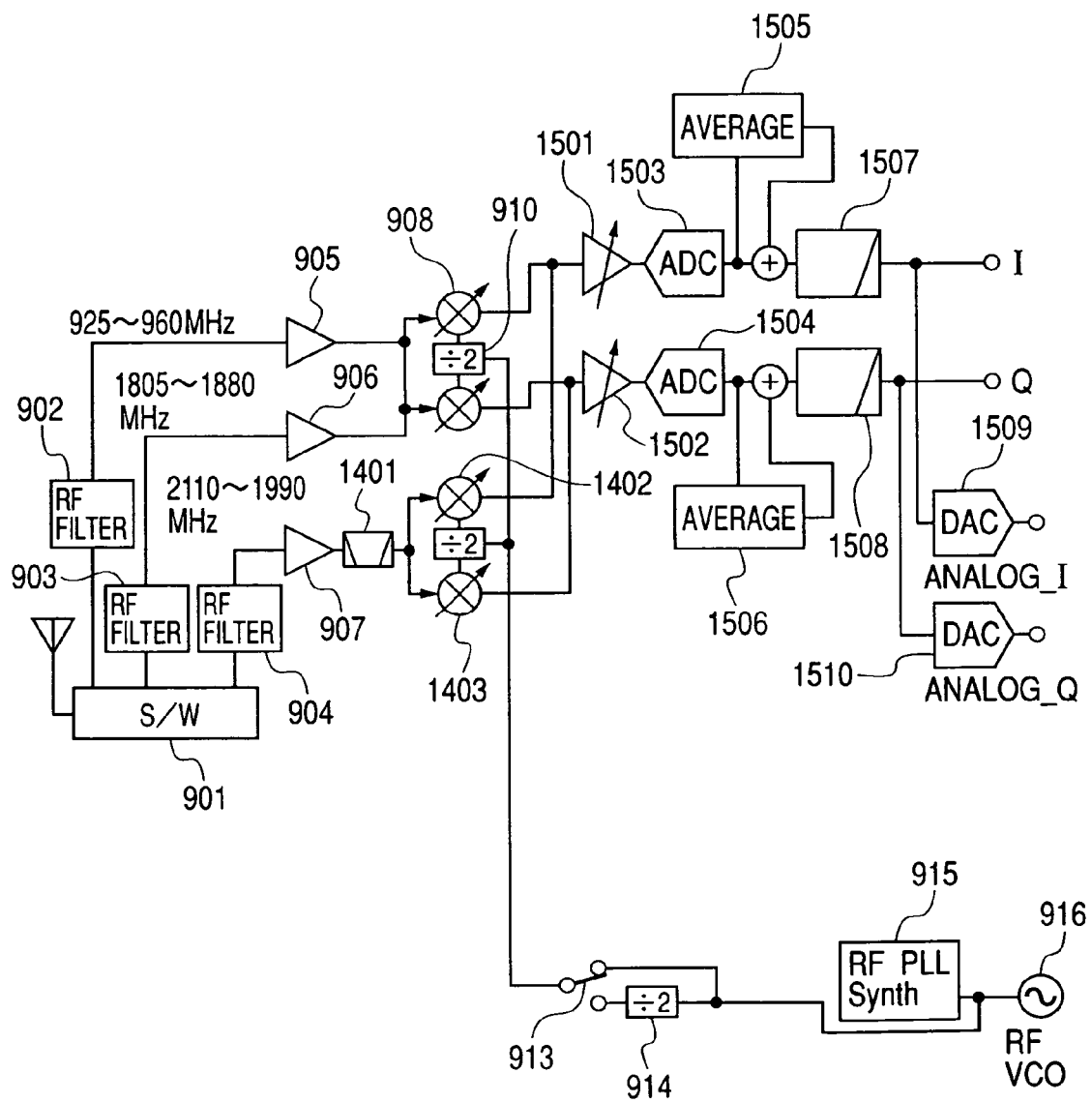
FIG. 15 is a block diagram showing a reception circuit according to a seventh embodiment of the present invention.

With reference to FIG. 15, the description will be made of a seventh embodiment according to the present invention. Here, the row of the variable gain amplifier and the low-pass filter which have been realized by the analog circuit in the sixth embodiment is realized by a digital circuit, and one circuit is caused to cope with both GSM and W-CDMA systems. A DC offset which occurs at an output terminal of the mixer 908, 909, 1402, 1403 can be suppressed at about 5 mV at maximum. Also, DC offset output from a variable gain amplifier 1501, 1502 of gain 26 dB at maximum becomes 100 mV. When power gain of a low noise amplifier 905 to 907 and the mixer is assumed to be 20 dB and output impedance of the mixer is assumed to be 500Ω, the reception signal of −102 dBm (GSM minimum signal level) becomes 562 µV. If there is available an analog-to-digital converter (ADC) of 14 bits having a 2V dynamic range, it is possible to secure a margin of 19 dB or higher against the quantize noise level, and a DC offset of 100 mV is sufficiently smaller than the dynamic range of 2 V. For this reason, the reception circuit can be constituted without having any DC offset calibration function in the analog circuit, and it becomes possible to share the GSM and W-CDMA circuits.

After digitized, it becomes possible to remove the DC component by deducting an average value 1505, 1506 of the data. Also, since the filter has been digitized, it becomes easy to replace the GSM with the W-CDMA. Depending upon the interface of a base band LSI, it is also possible to return to an analog IQ signal by the digital-to-analog converter (DAC) 1509, 1510, for outputting. According to the present embodiment, it becomes possible to process the GSM and the W-CDMA with the same circuit.

<Eighth Embodiment>

Figure 16:
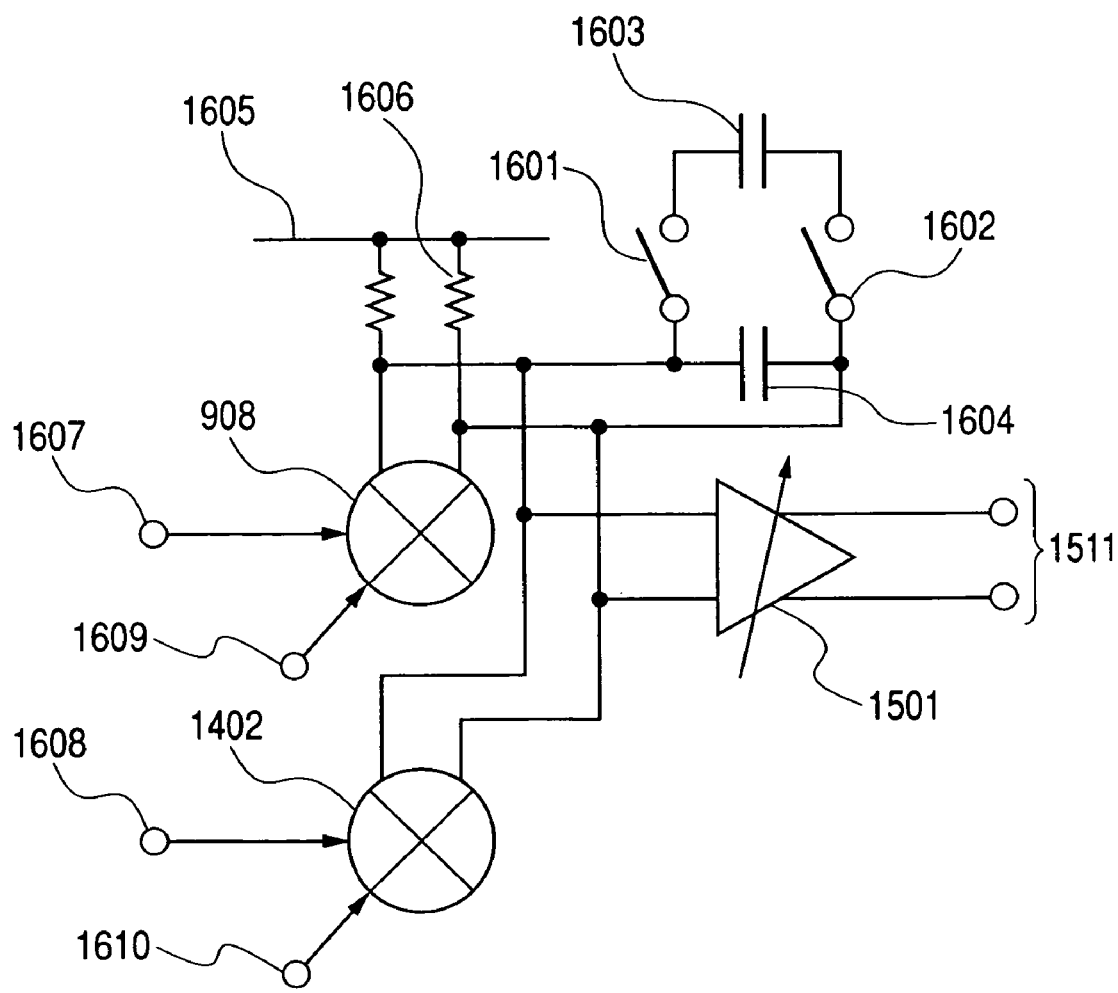
FIG. 16 is a block diagram showing a reception circuit according to an eighth embodiment of the present invention.
Figure 17:
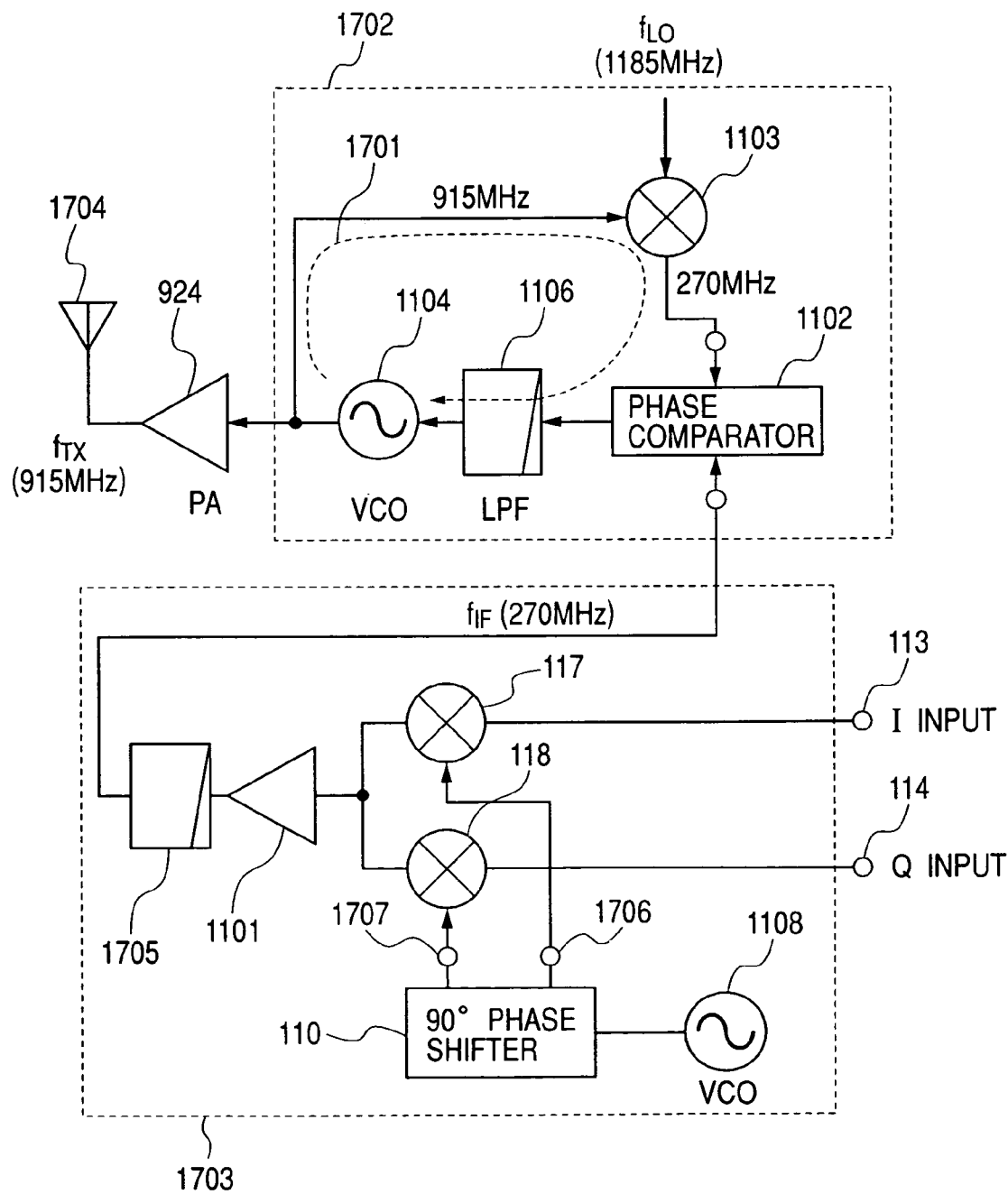
FIG. 17 is a block diagram showing a transmitter circuit of a conventional offset PLL type transmitter.

With reference to FIG. 16, the description will be made of an eighth embodiment according to the present invention. In the present embodiment, an output unit of the mixer in the GSM and the W-CDMA has been used in common. The mixer 908 for GSM and the mixer 1402 for W-CDMA have local oscillation signal input terminals 1609, 1610 and high-frequency signal input terminals 1607, 1608 which are independent respectively, but the output end of each mixer is connected to a power source line 1605 through load resistance 1606 in common.

Since the GSM and the W-CDMA have different bands, it is necessary to change the cut-off frequency of the low-pass filter which is constituted by load resistance and capacity. During GSM reception, the switch 1601, 1602 is closed, and the exterior large capacity 1603 is connected to the output end of each mixer to realize a low cut-off frequency, while during W-CDMA reception, the switch is opened to realize a high cut-off frequency which is determined by the built-in capacity 1604 and the load resistance 1606. After the disturbing wave is suppressed by the filter, the signal can be amplified by the variable gain amplifier 1501, and the output 1511 can be applied to, for example, the analog-to-digital converter 1503, 1504 shown in FIG. 15. According to the present embodiment, it is possible to use the circuit ahead of the mixer output unit of GSM and W-CDMA in common.

As will be apparent from the above-described embodiments, according to the present invention, as compared with when the conventional offset PLL type transmitter has been applied, it is possible to cope with a system such as the W-CDMA system in which information has been added to a change in amplitude, to reduce necessary exterior components in addition to the RF integrated circuit, the power amplifier, the front end circuit, and to constitute a dual mode transceiver of GSM/GSM1800/W-CDMA.

What is claimed is:

1. A transmitter circuit comprising:

first and second mixers;

first, second and third amplifiers;

a 90° phase shifter;

a first oscillator;

first and second voltage controlled current sources with first and second differential input terminals respectively;

a switch portion for switching a direction of a differential signal on the basis of a local oscillation signal;

first and second current sources; and a load in common to both mixers for picking out differential output of said first and second mixers, wherein output terminals of said first and second mixers are connected to input terminals of said first amplifier;

local signal input terminals of said first and second mixers are provided for receiving local oscillation signals from said first oscillator to said first and said second mixers and;

first and second output terminals of said 90° phase shifter are connected to said local signal input terminals of said first and second mixers;

output terminals of said second and third amplifiers are connected to baseband signal input terminals of said first and second mixers;

wherein an input terminal of said second amplifier is used as a first input terminal of said transmitter circuit; and an input terminal of said third amplifier is a second input terminal of said transmitter circuit; and an output terminal of said first amplifier is an entire output terminal for said transmitter circuit; and wherein said second and third amplifiers are provided with a variable gain circuit, wherein bias current of said first and second mixers change in proportion to an amplification factor of said second and third amplifiers, wherein said 90° phase shifter includes a divider where said first and second input terminals are a first differential output terminal and a second differential output terminal which together can output a 90° phase-shifted signal respectively, wherein said first and second mixers with said signal input terminals of said first and second mixers are differential input terminals respectively, a switch portion for switching a direction of a differential signal on the basis of a local oscillation signal, wherein said first differential output terminal and said second differential output terminal with said 90° phase-shifted signal from said divider are connected to the first differential input terminal of said switch portion respectively, wherein outputs of said first and second voltage controlled current sources and outputs of said first and second current sources are connected to a second differential input terminal of said switch portion respectively, wherein the differential output terminals of said switch portion are connected to said load in common, wherein said second and third amplifiers provided with said variable gain circuit comprising a variable attenuator having a differential input terminal and a differential output terminal respectively, wherein the differential output from said variable attenuator is connected to said differential input terminals of said first and second voltage controlled current sources, and wherein amounts of current of said first and second current sources and an attenuation level of said variable attenuator are controlled by a gain control signal.

2. The transmitter circuit according to claim 1, wherein said first, second and third amplifiers are DC amplifiers each include a differential circuit;

wherein each of said first and second mixers comprises a differential circuit; and wherein by using a common mode input voltage of said second and third amplifiers, bias current of said first and second mixers is controlled through said second and third amplifiers.

3. The transmitter circuit according to claim 1, wherein said transmitter circuit is arranged such that there are provided a plurality of transmitter circuits within the transmitter circuit, wherein input and output terminals of each of said plurality of transmitter circuits are connected in common, wherein a respectively different bias current is sent to each of said transmitter circuits, and wherein a number of articles to be operated by each of said plurality of transmitter circuits is changed in accordance with the transmitting power which is controlled by a variable attenuator.

4. The transmitter circuit according to claim 1 further comprising:

a direct conversion reception circuit, in which said transmitter circuit and a reception circuit both operate correspondingly to at least a first frequency band and a second frequency band, and wherein said circuits are integrated on a same semiconductor chip in an integrated circuit, wherein said integrated circuit has first and second local oscillation signal generating circuits so that a first local oscillation signal having a 90° phase difference for transmission and reception which corresponds to said first frequency band is generated by dividing an oscillation signal of said first local oscillation circuit into two equal portions; and so that a second local oscillation signal having a 90° phase difference for transmission and reception which corresponds to said second frequency band is generated by dividing an oscillation signal of said first local oscillation circuit into two equal portions.

5. The transmitter circuit according to claim 4 further comprising:

a additional receive-only low noise amplifier and an additional mixer pair on said integrated circuit, wherein between said additional receive-only low noise amplifier and said additional mixer pair, an exterior band pass filter is connected.

6. The transmitter circuit according to claim 5 further comprising:

a digital circuit connected to an output of an analog-to-digital converter, said digital circuit having a filter function having a low pass characteristic to a digitized signal, and a function for determining an average to deduct an average value from an I, Q input signal; and a digital-to-analog converter, wherein the digital circuit is arranged such that respective output signals of I, Q which are outputted to a plurality of mixers for I signals, Q signals of a reception circuit portion is connected respectively, are amplified by a variable gain amplifier, wherein an output of said variable gain amplifier is connected to input of one set of analog-to-digital converters for I, Q, and wherein the digital signal after the processing is outputted or the signal is outputted after converted into analog by the digital-to-analog converter.

7. The transmitter circuit according to claim 6, wherein the structure is arranged such that differential output from a plurality of mixers for I signal, Q signal is connected to first and second load resistance in common respectively, wherein between said first and second load resistance, there are provided a plurality of capacitors through a switch, and wherein a capacitance value is made variable by the switch.

8. The transmitter circuit according to claim 1 further comprising:

a first band pass filter connected to the output of the first amplifier;

a third mixer connected to the output of the first bandpass filter;

a fourth amplifier connected to the output of the third mixer;

an intermediate frequency synthesizer connected to the phase shifter;

a high frequency synthesizer connected to the third mixer; and a second oscillator connected to the high frequency synthesizer, wherein an output terminal of said fourth amplifier is used as an output terminal from said entire integrated circuit, wherein a local oscillation signal input terminal of said third mixer is connected to an output terminal of said second oscillator, and wherein said second oscillator is set to a desired frequency by said high frequency synthesizer.

* * * * *